US011651990B2

(12) United States Patent
Han et al.

(10) Patent No.: US 11,651,990 B2
(45) Date of Patent: May 16, 2023

(54) SUBSTRATE PROCESSING APPARATUS AND DRIVING METHOD THEREOF

(71) Applicant: Samsung Electronics Co., Ltd., Suwon-si (KR)

(72) Inventors: Ilyoung Han, Uiwang-si (KR); Hunyong Park, Seoul (KR); Sohee Han, Hwaseong-si (KR); Nohsung Kwak, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 515 days.

(21) Appl. No.: 16/712,413

(22) Filed: Dec. 12, 2019

(65) Prior Publication Data

US 2021/0005504 A1    Jan. 7, 2021

(30) Foreign Application Priority Data

Jul. 3, 2019 (KR) ........................ 10-2019-0080129

(51) Int. Cl.
*H01L 21/687* (2006.01)

(52) U.S. Cl.
CPC .. *H01L 21/68742* (2013.01); *H01L 21/68785* (2013.01)

(58) Field of Classification Search
CPC ......... H01L 21/68742; H01L 21/68785; H01L 21/68764; H01L 21/683
See application file for complete search history.

(56) References Cited

U.S. PATENT DOCUMENTS

| D568,914 S | 5/2008 | Or et al. |
| 7,377,978 B2 | 5/2008 | Nishizawa |
| 7,407,559 B2 | 8/2008 | Murata et al. |
| 7,436,645 B2 | 10/2008 | Holland et al. |
| 7,458,762 B2 | 12/2008 | Han et al. |
| 7,473,061 B1 | 1/2009 | Santangelo |
| 7,527,694 B2 | 5/2009 | Sundar |
| 7,530,338 B2 | 5/2009 | Falkowski et al. |
| 7,556,770 B2 | 7/2009 | Justin et al. |
| 7,608,150 B2 | 10/2009 | Park et al. |
| 7,615,116 B2 | 11/2009 | Kanaya et al. |
| 7,638,003 B2 | 12/2009 | Satoh et al. |

(Continued)

FOREIGN PATENT DOCUMENTS

| JP | 3456890 B2 | 8/2003 |
| JP | 2005-197380 A | 7/2005 |

(Continued)

*Primary Examiner* — Mahdi H Nejad
(74) *Attorney, Agent, or Firm* — Muir Patent Law, PLLC

(57) ABSTRACT

The present disclosure is related to a substrate processing apparatus. The substrate processing apparatus may include a chuck including a plurality of pin holes and a plurality of lift pins positioned to rise and fall through the plurality of pin holes. The substrate processing apparatus may include a lift plate configured to raise and lower the lift pins. The plurality of lift pins may include a lift pin having a rod shape configured to move up and down in a pin hole of the plurality of pin holes, a flexure coupled to a lower portion of the lift pin, a weight body positioned underneath the lift plate, and a weight string connecting the flexure and the weight body. The lift plate may include a string hole through which the weight string passes through.

15 Claims, 8 Drawing Sheets

(56) References Cited

U.S. PATENT DOCUMENTS

| | | |
|---|---|---|
| 7,647,701 B1 | 1/2010 | Mollick et al. |
| 7,649,729 B2 | 1/2010 | Buchberger, Jr. et al. |
| 7,651,583 B2 | 1/2010 | Kent et al. |
| 7,677,829 B2 | 3/2010 | Westhoff et al. |
| 7,686,052 B2 | 3/2010 | Song et al. |
| 7,690,373 B2 | 4/2010 | Telford et al. |
| 7,691,205 B2 | 4/2010 | Ikedo |
| 7,695,213 B1 | 4/2010 | Akkala et al. |
| 7,731,798 B2 | 6/2010 | Shareef et al. |
| 7,750,818 B2 | 7/2010 | Lee |
| 7,762,051 B2 | 7/2010 | Fackler et al. |
| 7,763,311 B2 | 7/2010 | Suzuki |
| 7,770,478 B2 | 8/2010 | Son |
| 7,813,103 B2 | 10/2010 | Shannon et al. |
| 7,878,163 B2 | 2/2011 | Kim et al. |
| 7,879,151 B2 | 2/2011 | Nguyen et al. |
| D635,597 S | 4/2011 | Tiner |
| 7,927,425 B2 | 4/2011 | Chiang et al. |
| D640,715 S | 6/2011 | Tiner |
| 7,959,735 B2 | 6/2011 | Sterling et al. |
| 7,960,254 B2 | 6/2011 | Wada et al. |
| 7,964,038 B2 | 6/2011 | Patalay et al. |
| 7,988,817 B2 | 8/2011 | Son |
| 7,993,462 B2 | 8/2011 | Takahashi |
| 7,995,323 B2 | 8/2011 | Lu et al. |
| 7,997,851 B2 | 8/2011 | Moore et al. |
| 8,000,081 B2 | 8/2011 | Lu et al. |
| 8,033,527 B2 | 10/2011 | Pasto |
| 8,062,717 B2 | 11/2011 | Blonigan et al. |
| 8,063,388 B2 | 11/2011 | Takahashi |
| D650,818 S | 12/2011 | Tiner |
| 8,111,499 B2 | 2/2012 | Ni et al. |
| 8,126,587 B2 | 2/2012 | Koo et al. |
| 8,132,673 B1 | 3/2012 | Gutentag |
| 8,148,665 B2 | 4/2012 | Lim |
| 8,163,087 B2 | 4/2012 | Faguet et al. |
| 8,181,761 B2 | 5/2012 | Jayaram et al. |
| 8,194,384 B2 | 6/2012 | Nasman et al. |
| 8,256,754 B2 | 9/2012 | Lerner et al. |
| 8,267,143 B2 | 9/2012 | George et al. |
| 8,268,087 B2 | 9/2012 | Kamikawa et al. |
| 8,277,673 B2 | 10/2012 | Tsujimoto et al. |
| 8,287,688 B2 | 10/2012 | Wallace et al. |
| 8,303,716 B2 | 11/2012 | Wallace et al. |
| 8,307,522 B2 | 11/2012 | Kobayashi |
| 8,313,612 B2 | 11/2012 | McMillin et al. |
| 8,314,371 B2 | 11/2012 | Sorabji et al. |
| 8,323,410 B2 | 12/2012 | Wallace et al. |
| 8,343,300 B2 | 1/2013 | Hermanowski |
| 8,363,378 B2 | 1/2013 | Bluck et al. |
| 8,365,682 B2 | 2/2013 | Blonigan et al. |
| 8,366,873 B2 | 2/2013 | George |
| 8,367,227 B2 | 2/2013 | Sun et al. |
| 8,383,000 B2 | 2/2013 | Tsujimoto et al. |
| 8,398,783 B2 | 3/2013 | Lee et al. |
| 8,404,048 B2 | 3/2013 | Ewert et al. |
| 8,416,555 B2 | 4/2013 | Lu et al. |
| 8,434,787 B2 | 5/2013 | Halepatali et al. |
| 8,444,364 B2 | 5/2013 | Blonigan et al. |
| 8,444,772 B2 | 5/2013 | Itoh et al. |
| 8,490,500 B2 | 7/2013 | Foster et al. |
| 8,534,971 B2 | 9/2013 | Muramatsu et al. |
| 8,543,235 B2 | 9/2013 | Fujii |
| 8,580,078 B2 | 11/2013 | Bailey, III et al. |
| 8,603,249 B2 | 12/2013 | Kim et al. |
| 8,628,675 B2 | 1/2014 | McMillin et al. |
| 8,672,603 B2 | 3/2014 | Blonigan et al. |
| 8,714,078 B2 | 5/2014 | Ueno et al. |
| 8,721,908 B2 | 5/2014 | Bailey, III et al. |
| 8,727,419 B2 | 5/2014 | Syvret et al. |
| 8,763,296 B1 | 7/2014 | Chvala |
| 8,778,133 B2 | 7/2014 | Kuga |
| 8,778,813 B2 | 7/2014 | Sankarakrishnan et al. |
| 8,790,022 B2 | 7/2014 | Yi |
| 8,814,142 B2 | 8/2014 | Pasto et al. |
| 8,837,924 B2 | 9/2014 | Tsunekawa et al. |
| 8,840,754 B2 | 9/2014 | Hao |
| 8,858,715 B2 | 10/2014 | Van Munster et al. |
| 8,869,811 B2 | 10/2014 | Ogata et al. |
| 8,871,312 B2 | 10/2014 | Sun et al. |
| 8,888,087 B2 | 11/2014 | Okabe et al. |
| 8,898,889 B2 | 12/2014 | Nam et al. |
| 8,900,471 B2 | 12/2014 | Green et al. |
| 8,919,412 B2 | 12/2014 | George et al. |
| 8,919,901 B2 | 12/2014 | Lee et al. |
| 8,933,375 B2 | 1/2015 | Dunn et al. |
| 8,940,115 B2 | 1/2015 | Shimazu |
| 8,955,245 B2 | 2/2015 | Chvala |
| 8,961,256 B2 | 2/2015 | Yi |
| 8,968,476 B2 | 3/2015 | Shin et al. |
| 8,980,001 B2 | 3/2015 | Sakurai et al. |
| 8,982,530 B2 | 3/2015 | Lin et al. |
| 8,999,106 B2 | 4/2015 | Liu et al. |
| 9,048,269 B2 | 6/2015 | Higashijima et al. |
| 9,075,266 B2 | 7/2015 | Zhu et al. |
| 9,082,799 B2 | 7/2015 | Weaver et al. |
| 9,083,182 B2 | 7/2015 | Sato |
| 9,086,171 B2 | 7/2015 | Meyer |
| 9,096,331 B2 | 8/2015 | Gehlsen |
| 9,096,930 B2 | 8/2015 | Doering et al. |
| 9,096,949 B2 | 8/2015 | Okabe et al. |
| 9,108,322 B2 | 8/2015 | Chisholm et al. |
| 9,123,765 B2 | 9/2015 | Samir et al. |
| 9,129,895 B2 | 9/2015 | Liu et al. |
| 9,165,800 B2 | 10/2015 | Namba |
| 9,218,997 B2 | 12/2015 | Jun et al. |
| 9,222,165 B2 | 12/2015 | Hosokawa et al. |
| 9,250,514 B2 | 2/2016 | Wu et al. |
| 9,275,887 B2 | 3/2016 | Matyushkin et al. |
| 9,281,229 B2 | 3/2016 | George et al. |
| 9,299,595 B2 | 3/2016 | Dunn et al. |
| 9,316,408 B2 | 4/2016 | Justus |
| 9,337,067 B2 | 5/2016 | Roy et al. |
| 9,340,357 B2 | 5/2016 | Wilkins et al. |
| 9,361,863 B1 | 6/2016 | McClary |
| 9,368,379 B2 | 6/2016 | Chen et al. |
| 9,371,584 B2 | 6/2016 | Kim |
| 9,401,299 B2 | 7/2016 | Sowden et al. |
| 9,402,961 B2 | 8/2016 | Leak et al. |
| 9,411,233 B2 | 8/2016 | Li et al. |
| 9,429,363 B2 | 8/2016 | Heinemann et al. |
| 9,449,807 B2 | 9/2016 | Namba |
| 9,458,656 B2 | 10/2016 | Mickelson |
| 9,484,233 B2 | 11/2016 | Leeser |
| 9,487,987 B2 | 11/2016 | Baczweski et al. |
| 9,506,973 B2 | 11/2016 | Simmons et al. |
| 9,508,584 B2 | 11/2016 | Cox et al. |
| 9,532,401 B2 | 12/2016 | Cong et al. |
| 9,543,187 B2 | 1/2017 | Cooke |
| 9,551,428 B2 | 1/2017 | Wang |
| 9,570,716 B2 | 2/2017 | Yun et al. |
| 9,579,905 B2 | 2/2017 | Ko et al. |
| 9,594,269 B2 | 3/2017 | Wang et al. |
| 9,608,549 B2 | 3/2017 | Parkhe et al. |
| 9,650,726 B2 | 5/2017 | Myo et al. |
| 9,666,467 B2 | 5/2017 | Parkhe |
| 9,673,074 B2 | 6/2017 | Wu et al. |
| 9,673,077 B2 | 6/2017 | Lindley |
| 9,711,406 B2 | 7/2017 | Martinez et al. |
| 9,721,910 B2 | 8/2017 | Hamaguchi |
| 9,728,429 B2 | 8/2017 | Ricci et al. |
| 9,741,599 B2 | 8/2017 | Simmons et al. |
| 9,771,249 B2 | 9/2017 | Scott |
| 9,773,692 B2 | 9/2017 | Cox et al. |
| 9,779,847 B2 | 10/2017 | Miller et al. |
| 9,779,971 B2 | 10/2017 | Ravi et al. |
| 9,799,548 B2 | 10/2017 | Sheelavant et al. |
| 9,815,091 B2 | 11/2017 | Ngai et al. |
| 9,818,585 B2 | 11/2017 | Green et al. |
| 9,818,587 B2 | 11/2017 | Ewert et al. |
| 9,824,787 B2 | 11/2017 | Miller et al. |
| 9,839,106 B2 | 12/2017 | Miller et al. |
| 9,839,107 B2 | 12/2017 | Miller |
| 9,853,579 B2 | 12/2017 | Subramani et al. |

(56) References Cited

U.S. PATENT DOCUMENTS

| | | |
|---|---|---|
| 9,854,723 B2 | 1/2018 | Sudbrack et al. |
| 9,865,494 B2 | 1/2018 | Ichinose |
| 9,883,549 B2 | 1/2018 | Matyushkin et al. |
| 9,917,001 B2 | 3/2018 | Desai et al. |
| 9,947,517 B1 | 4/2018 | Luere et al. |
| 9,957,615 B2 | 5/2018 | Tzu et al. |
| 9,960,068 B1 | 5/2018 | Konkola et al. |
| 9,978,632 B2 | 5/2018 | Nguyen et al. |
| 9,988,115 B2 | 6/2018 | Jarvis |
| 9,991,153 B2 | 6/2018 | Hou |
| 10,020,220 B2 | 7/2018 | Konkola et al. |
| 10,036,437 B2 | 7/2018 | Schoenauer et al. |
| 10,040,175 B2 | 8/2018 | Kumakura et al. |
| 10,041,735 B2 | 8/2018 | Yu et al. |
| 10,049,862 B2 | 8/2018 | Brown et al. |
| 10,053,934 B2 | 8/2018 | Keogh et al. |
| 10,062,597 B2 | 8/2018 | Simmons et al. |
| 10,073,043 B2 | 9/2018 | Jeanne et al. |
| 10,083,883 B2 | 9/2018 | Tedeschi et al. |
| 10,086,340 B2 | 10/2018 | Ansley et al. |
| 10,103,010 B2 | 10/2018 | Luere et al. |
| 10,119,193 B2 | 11/2018 | Hariya |
| 10,161,041 B2 | 12/2018 | Lo et al. |
| 10,163,676 B2 | 12/2018 | Chen et al. |
| 10,179,941 B1 | 1/2019 | Khan et al. |
| 10,192,770 B2 | 1/2019 | Yudovsky |
| 10,195,704 B2 | 2/2019 | Himmelsbach et al. |
| 10,204,807 B2 | 2/2019 | Chou et al. |
| 10,211,033 B2 | 2/2019 | Nguyen et al. |
| 10,224,224 B2 | 3/2019 | Liang et al. |
| 10,242,890 B2 | 3/2019 | Volfovski et al. |
| 10,246,777 B2 | 4/2019 | Kondo |
| 10,249,522 B2 | 4/2019 | Wu et al. |
| 2008/0134814 A1* | 6/2008 | Kim .................. H01L 21/68742 118/500 |
| 2010/0032096 A1* | 2/2010 | Yu ..................... H01L 21/68721 156/345.52 |
| 2014/0097175 A1 | 4/2014 | Yu et al. |
| 2016/0099166 A1* | 4/2016 | Yudovsky ......... H01L 21/68764 269/21 |
| 2016/0281263 A1* | 9/2016 | Oki .................. H01L 21/68785 |
| 2017/0301579 A1* | 10/2017 | Hosaka ............ H01L 21/68764 |
| 2019/0035671 A1* | 1/2019 | Ha .................... H01L 21/68757 |
| 2022/0091519 A1* | 3/2022 | Do ...................... G03F 7/70808 |

FOREIGN PATENT DOCUMENTS

| | | |
|---|---|---|
| JP | 2006-303138 A | 11/2006 |
| JP | 5561664 B2 | 6/2014 |
| KR | 2004-0009247 A | 1/2004 |
| KR | 2006-0078545 A | 7/2006 |
| KR | 2007-0080768 A | 8/2007 |
| KR | 10-0989852 B1 | 10/2010 |
| KR | 2013-0015614 A | 2/2013 |
| KR | 10-173898 6 B1 | 5/2017 |
| KR | 2018-0014414 A | 2/2018 |

\* cited by examiner

SUBSTRATE PROCESSING APPARATUS AND DRIVING METHOD THEREOF

CROSS-REFERENCE TO RELATED APPLICATION

This application claims priority under 35 U.S.C. § 119 to Korean Patent Application No. 10-2019-0080129, filed on Jul. 3, 2019, the disclosure of which is incorporated by reference herein in its entirety.

BACKGROUND

1. Field

The present disclosure relates to a substrate processing apparatus capable of preventing and/or suppressing breakage of a lift pin and a driving method thereof.

2. Description of Related Art

As a lift plate of a substrate processing apparatus rises, a plurality of lift pins rise. As a result, the lift pins push up the substrate (e.g., a wafer) disposed on a chuck. The lift plate may be raised or lowered while the lift pins are inclined. In this case, the lift pins may be pinched in the pin holes of the chuck, thereby causing the lift pins to be damaged and/or broken. In addition, the lift plate may be raised or lowered while the lift plate is inclined. In this case, the lift pins may be pinched in the pin holes and damage to the lift pins may occur. In addition, foreign matter or particles may be present at the bottom of the lift plate. When foreign matter or particles come into contact with the bottom surface of the lift pin(s), the lift pin(s) may tilt. As a result, the lift pin(s) may be caught in the pin holes, and the lift pins may be damaged and/or broken.

SUMMARY

Aspects of the present disclosure are related to a substrate processing apparatus. The substrate processing apparatus may include a chuck including a plurality of pin holes and a plurality of lift pins positioned to rise and fall through the plurality of pin holes. The substrate processing apparatus may include a lift plate configured to raise and lower the lift pins. The plurality of lift pins may include a lift pin having a rod shape configured to move up and down in a pin hole of the plurality of pin holes, a flexure coupled to a lower portion of the lift pin, a weight body positioned underneath the lift plate, and a weight string connecting the flexure and the weight body. The lift plate may include a string hole through which the weight string passes through.

Additional aspects of the present disclosures are related to a substrate processing apparatus. The substrate processing apparatus may include a chamber and a chuck disposed in the chamber. The chuck may include a plurality of pin holes. The substrate processing apparatus may include a plurality of lift pins positioned to rise and fall through the plurality of pin holes, and a lift plate configured to raise and lower the plurality of lift pins. The plurality of lift pins may include: a lift pin having a rod shape, the lift pin being configured to move up and down within a pin hole of the plurality of pin holes, and a flexure coupled to a lower portion of the lift pin.

Additional aspects of the present disclosures are related to a substrate processing apparatus. The substrate processing apparatus may include a chamber and a chuck disposed in the chamber. The chuck may include a plurality of pin holes. The substrate processing apparatus may include a plurality of lift pins positioned to rise and fall through the plurality of pin holes, and a lift plate configured to raise and lower the plurality of lift pins. The plurality of lift pins may include: a lift pin having a rod shape, the lift pin being configured to move up and down within a pin hole of the plurality of pin holes, a weight block coupled to a lower portion of the lift pin, a weight body positioned beneath the lift plate, and a weight string connecting the weight block and the weight body. The lift plate may include a string hole through which the weight string is configured to pass through.

According to embodiments according to the present disclosure, when the lift plate pushes up the lift pin unit, the lift pin may be vertically aligned in the pin hole while the flexure is deformed in the X and Y axis directions. When the lift plate is raised and lowered, it is possible to prevent and/or suppress the lift pins from breaking.

BRIEF DESCRIPTION OF THE DRAWINGS

Features will become apparent to those of skill in the art by describing in detail exemplary embodiments with reference to the attached drawings in which.

DETAILED DESCRIPTION OF EXEMPLARY EMBODIMENTS

Hereinafter, semiconductor packages according to example embodiments of the inventive concept will be described with reference to the accompanying drawings.

Figure 1:
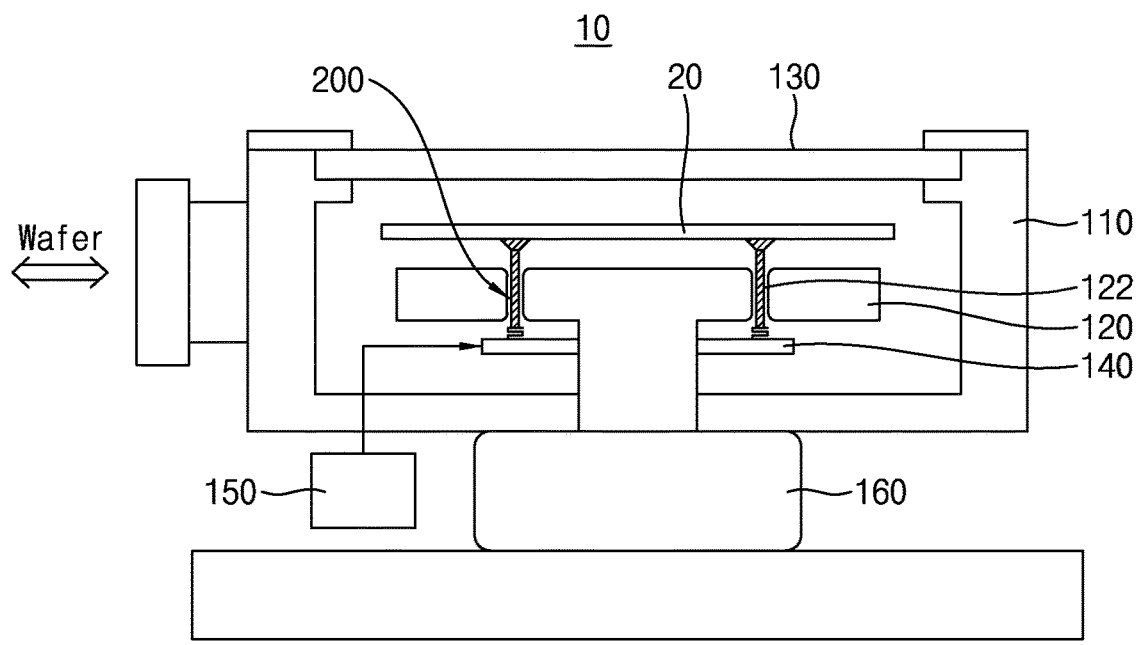
FIG. 1 is a substrate processing apparatus according to an exemplary embodiment of the present disclosure, and illustrates a lift up state in which a lift pin unit is raised.
Figure 2:
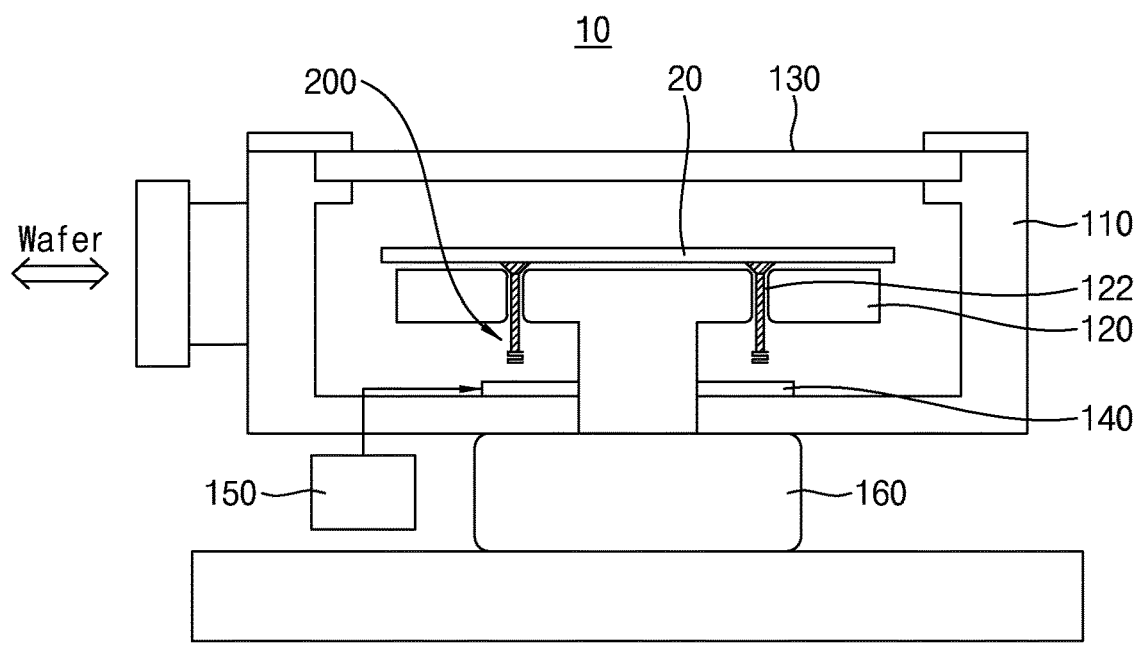
FIG. 2 is a substrate processing apparatus according to an embodiment of the present disclosure, and illustrates a lift down state in which a lift pin unit is lowered.

FIG. 1 is a substrate processing apparatus 10 according to an exemplary embodiment of the present disclosure, and illustrates a lift up state in which a lift pin unit 200 is raised. FIG. 2 is a substrate processing apparatus 10 according to an embodiment of the present disclosure, and illustrates a lift down state in which a lift pin unit 200 is lowered.

Referring to FIGS. 1 and 2, a substrate processing apparatus 10 according to an embodiment of the present disclosure is an apparatus for processing a substrate 20 (e.g., a wafer) to manufacture a semiconductor device. The substrate processing apparatus 10 may include a chamber 110, a chuck 120, a chamber window 130, a plurality of lift pin units 200, and a lift plate 140, a driving unit 150, and a chamber support plate 160.

The substrate 20 may be seated on the chuck 120. The chamber window 130 may be formed on one side of the chamber 110. The chamber window 130 may include a transparent window for visually confirming a progress state of the process from the outside. The plurality of lift pin units 200 may support a lower portion of the substrate 20 and move up and down. The lift plate 140 may raise or lower the plurality of lift pin units 200. The driving unit 150 may drive the lift plate 140 up and down. The chamber support plate 160 may support the chamber 110.

A space for disposing the substrate 20, the lift pin unit 200, and the lift plate 140 may be provided in the chamber 110. The chamber 110 may be a physical vapor deposition (PVD) chamber or a chemical vapor deposition (CVD) chamber, for example.

The substrate 20 may be loaded into the chamber 110. The chuck 120 may have a flat upper surface on which the substrate 20 loaded into the chamber 110 is seated. The chuck 120 may fix the substrate 20 using a vacuum or electrostatic method. The chuck 120 may include a heater therein (not illustrated). The substrate 20 mounted on the chuck 120 may be heated to a predetermined temperature by the heater. In addition, the chuck 120 may further include a cooler (not illustrated). The substrate 20 heated during the manufacturing process may be cooled by the cooler.

A plurality of pin holes 122 may be formed in the chuck 120. The plurality of pin holes 122 may be formed to penetrate the chuck 120 in a vertical direction. A plurality of lift pins 210 (see FIG. 3A-9) may be inserted into the plurality of pin holes 122, respectively. The plurality of lift pins 210 may support the substrate 20. The plurality of pin holes 122 may be uniformly spaced apart from each other at a predetermined interval. The plurality of lift pins 210 may move up and down through the plurality of pin holes 122. For example, each lift pin 210 may be configured to move up and down in a corresponding pin hole 122.

In the process of manufacturing a semiconductor device, various manufacturing processes such as deposition, coating, developing, etching, and cleaning may be repeatedly performed on the substrate 20. In order to proceed with manufacturing processes such as deposition, coating, developing, etching, and cleaning, the substrate 20 may be loaded into the chamber 110. When the individual manufacturing process is completed, the substrate 20 may be unloaded to the outside of the chamber 110.

When loading the substrate 20 into the chamber 110, the plurality of lift pin units 200 may be raised and lowered by using the lift plate 140. For example, the lift plate may be configured to and/or positioned to raise and lower the plurality of lift pin units. The substrate 20 may move up and down by raising and lowering the plurality of lift pin units 200.

When unloading the substrate 20 to the outside of the chamber 110, the plurality of lift pin units 200 may be raised and lowered by using the lift plate 140. The substrate 20 may be moved up and down by raising and lowering the plurality of lift pin units 200.

Figure 3A:
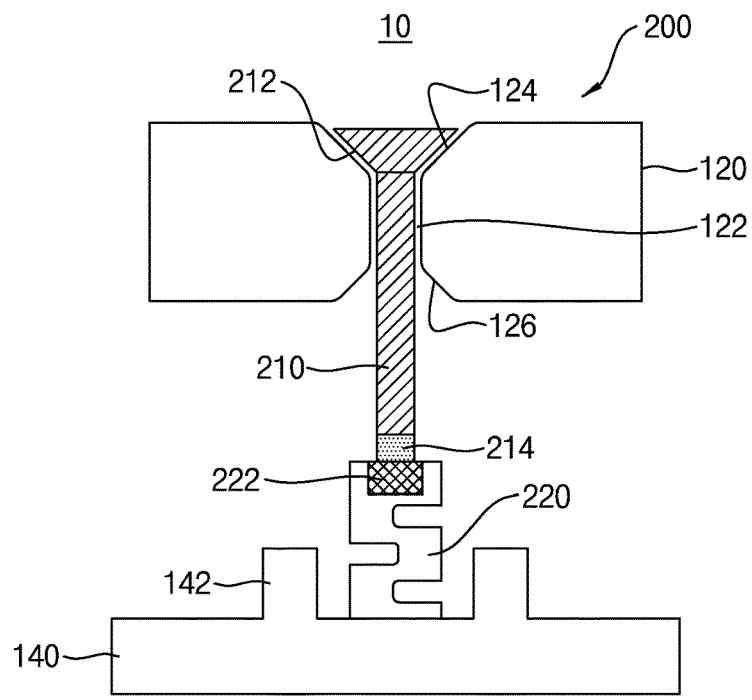
FIG. 3A is a diagram illustrating a lift pin unit and a lift plate according to one embodiment of the present disclosure.

FIG. 3A is a diagram illustrating a lift pin unit 200 and a lift plate 140 according to one embodiment of the present disclosure.

Referring to FIGS. 1, 2, and 3A, the lift pin unit 200 may include a lift pin 210 and a flexure 220. The lift pin 210 may include a tip portion 212 and a metal plate 214. The tip portion 212 may be disposed above the lift pin 210. The metal plate 214 may be disposed below the lift pin 210.

The substrate 20 may be loaded into the chamber 110 using a robotic arm (not illustrated). The lift pin unit 200 may be moved up as the lift plate 140 rises.

The substrate 20 may be positioned on the tip portion 212 of the lift pin 210 of the lift pin unit 200. In order to proceed with the manufacturing process, the lift plate 140 may be moved down, and thus the lift pin unit 200 may be lowered.

When the lift pin unit 200 descends, the substrate 20 may be seated on the chuck 120. When the manufacturing process is completed, the lift plate 140 may rise to raise the lift pin unit 200. As the lift pin unit 200 rises, the lift pin 210 may rise, and the substrate 20 seated on the chuck 120 may rise. When the substrate 20 is raised, the robotic arm may unload the substrate 20 to the outside of the chamber 110.

An upper side 124 of the plurality of pin holes 122 may include a funnel-shaped recess. When the lift plate 140 is lowered, the tip portion 212 of the lift pin 210 may be inserted into the concave portion having a funnel-shaped recess.

If the lift pin 210 is inclined with respect to the vertical direction, the lift pin 210 may not be caught in the pin hole 122 as a result of the funnel-shaped recess of the upper side 124. To this end, an edge portion of the upper side 124 of the plurality of pin holes 122 may be formed to be inclined or rounded. Since the edge portion of the upper side 124 may be inclined or rounded, the lift pin 210 may not be caught in the pin hole 122 even when the lift pin 210 is inclined.

Also, the lower side 126 of the pin hole 122 may include a funnel-shaped recess. The corner portion of the lower side 126 of the pin hole 122 may also be inclined or formed in a round shape. If the lift pin 210 is inclined with respect to the vertical direction, the lift pin 210 may be prevented from being caught in the corners of the upper side 124 and the lower side 126 of the pin hole 122.

The lift pin 210 of the lift pin unit 200 may have a rod shape and may include a low friction ceramic or engineered plastic (e.g., vespel, peek). The lift pin 210 may have a smaller diameter than the pin hole 122. For example, each lift pin 210 may correspond to a larger diameter pin hole 122.

The lift pin 210 may be inserted into the pin hole 122 to move up and down. The tip portion 212 of the lift pin 210 may have an inverted triangle, an inverted cone, or an inverted trapezoidal longitudinal section. The tip portion 212 may have a diameter smaller than the diameter of the upper side 124 (upper portion) of the pin hole 122.

Also, the tip portion 212 may have a diameter larger than the diameter of the central portion of the pin hole 122. Therefore, even if the lift plate 140 descends fully to the end, the tip portion 212 of the lift pin 210 may extend over the lower portion of the upper side 124. Therefore, the lift pins 210 do not fall out of the pin holes 122 when the lift plate 140 descends fully to a lift down state (see FIG. 2).

When the lift plate 140 is completely lowered, the tip portion 212 of the lift pin 210 may extend over the lower portion of the upper side 124 of the pin hole 122. When the tip portion 212 spans the lower portion of the upper side 124 of the pin hole 122, it may be vertically aligned by the weight of the lift pin 210.

The flexure 220 of the lift pin unit 200 may be bonded or fastened to the lower portion of the lift pin 210. The metal plate 214 may be formed of a metal having magnetic properties (for example, iron, nickel, cobalt, etc.) and may be disposed below the lift pin 210. The metal plate 214 may be disposed below the lift pin 210, i.e., the metal plate 214 may be disposed at or coupled to a bottom portion of the lift pin 210. A magnet 222 may be disposed on the flexure 220, e.g., an electrically magnetized metal or a permanent magnet 222 may be disposed at or coupled to a top portion of the flexure 220.

The metal plate 214 disposed under the lift pin 210 may be attracted to the magnetism of the magnet 222 disposed above the flexure 220. Accordingly, the lift pin 210 and the flexure 220 may be magnetically coupled at a junction of the metal plate 214 and magnet 222. Also, the lift pin 210 and the flexure 220 may be fastened through screws.

When the lift plate 140 is raised, the flexure 220 may be easily deformed (or bent) in the X-axis and Y-axis directions so that the lift pins 210 may be vertically aligned. That is, when the lift plate 140 is raised, the flexure 220 may first be bent before the lift pin 210 is tilted. As the flexure 220 is bent, the lift pin 210 may also be raised in a vertical direction. Also, the flexure 220 may be bent even when the lift pin 210 is inclined at a predetermined angle, e.g., a predetermined angle within acceptable tolerance. Accordingly, the lift pins 210 may be raised in the vertical direction.

As an example, the flexure 220 may be formed in a serpentine shape by bending a plate structure made of a flexible material several times. Since the flexure 220 may be formed in a serpentine shape, when pressure is applied, the flexure 220 can be easily deformed in the X-axis and Y-axis directions (can be bent).

When the lift plate 140 pushes up the lift pin unit 200, the lift pin 210 may be pinched in the pin hole 122. In this case, the flexure 220 may be vertically raised while also being deformed (bent) in the X and Y axis directions. The lift pins 210 may be vertically aligned in the pin holes 122 to prevent breakage of the lift pins 210.

The driving unit 150 may control the rising and falling of the lift plate 140. The driving unit 150 may be a conventional driver (mechanical actuator) such as a drive motor, a linear actuator, a micro linear actuator, a track actuator, a rod actuator, a voice coil motor, a linear motor, and/or a hydraulic system. Additionally, driving unit 150 may include a controller configured to send a signal that activates the driving unit 150, e.g., mechanical actuator to raise and lower the lift plate 140. The term "controller" is meant to be used in its broadest sense to include one or more controllers, computers and/or microprocessors, and/or other computer hardware, and/or software, and/or computer implemented algorithms that may be associated with the driving unit 150 and that may cooperate in controlling various functions and operations of lift plate 140. The lift plate 140 may be raised and lowered by the control of the driving unit 150. As the lift plate 140 is raised and lowered, the lift pin unit 200 may be raised and lowered.

The plurality of lift pin units 200 may be raised and lowered by the one lift plate 140. Alternatively, the plurality of lift pin units 200 may be raised and lowered by a plurality of lift plates 140.

A slide stopper 142 may be formed on an upper surface of the lift plate 140 to prevent the flexure 220 from sliding beyond a predetermined range. For example, the slide stopper 142 may prevent the flexure 220 from sliding too far that the lift pin 210 is not in vertical alignment with the pin hole 122. That is to say that the slide stopper 142 may be configured to prevent the lift pin 210 from becoming vertically misaligned by only allowing the flexure 220 to slide and/or deform by a predetermined amount. In this way, the slide stopper 142 is configured to maintain the lift pin 210 in vertical alignment with the pin hole 122 by retaining the flexure 220 within a predetermined range. The slide stopper 142 may be formed to surround side surfaces of the flexure 220. For example, the slide stopper 142 may have a ring like shape with a circular interior void space having an interior diameter. In this example embodiment, the interior diameter of the slide stopper 142 may be the same as the diameter of the pin hole 122 or about the same as the diameter of the pin hole 122. The diameter of the slide stopper 142 is not limited thereto, and may be larger than the diameter of the pin hole 122. Space may be provided inside the slide stopper 142 so that the flexure 220 can be inserted, e.g., a circular interior void space. When the lift plate 140 is raised and lowered, the flexure 220 may be located inside the slide stopper 142.

When the flexure 220 is deformed by an external pressure, the slide stopper 142 may limit the sliding of the flexure 220. That is, the flexure 220 may be prevented from sliding out beyond a predetermined range by the slide stopper 142. The slide stopper 142 may limit the sliding range of the flexure 220 so as not to deviate from the diameter of the pin hole 122. The slide stopper 142 may be configured to limit the flexure 220 from horizontal movement so that the lift pin 210 does not deviate outside of a center axis in the vertical direction of the pin hole 122 and thus the lift pin 210 remains vertically aligned. The lift pins 210 may be vertically aligned in the pin holes 122 to prevent breakage of the lift pins 210.

Figure 3B:
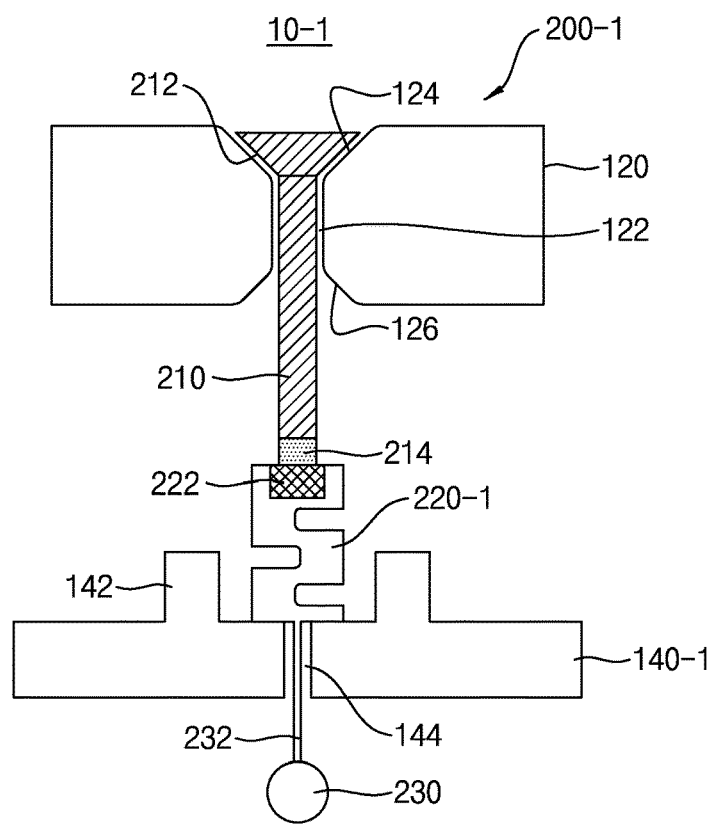
FIG. 3B is a view illustrating a lift pin unit and a lift plate according to one embodiment of the present disclosure.

FIG. 3B is a view illustrating a lift pin unit 200-1 and a lift plate 140-1 according to one embodiment of the present disclosure.

Referring to FIG. 3B, the substrate processing apparatus 10-1 may include a chuck 120, a plurality of lift pin units 200-1, and a lift plate 140-1.

The lift pin unit 200-1 may include a lift pin 210, a flexure 220-1, and a weight body 230. The weight body 230 may be suspended from the flexure 220-1 by a weight string 232.

A slide stopper 142 may be formed on an upper surface of the lift plate 140-1 to prevent the flexure 220-1 from sliding beyond a predetermined range.

A plurality of string holes 144 may be formed in the lift plate 140-1. The string holes 144 may be formed at positions corresponding to the plurality of lift pin units 200-1. The weight string 232 may connect the flexure 220-1 and the weight body 230. The first side of the weight string 232 may be connected to the lower portion of the flexure 220-1. The second side of the weight string 232 may be connected to the weight body 230. Accordingly, the weight body 230 may be suspended from the flexure 220-1 by the weight string 232 which passes through a corresponding string hole 144.

A plurality of weight strings 232 may pass through the lift plate 140-1 through a plurality of corresponding string holes 144. The weight body 230 may be located below the lift plate 140-1. The weight body 230 may be formed of a material having a specific gravity higher than that of the lift pin 210. The weight of the weight body 230 is added to the weights of the lift pins 210 and the flexure 220-1 so that the lift pins 210 may be vertically aligned.

When the lift plate 140-1 is raised and lowered, the lift pins 210 may be vertically aligned by the weight body 230. Even if the lift plate 140-1 is inclined, the lift pins 210 may be vertically aligned by the weight body 230. The lift pins 210 may be vertically aligned in the pin holes 122 to prevent breakage of the lift pins 210. In addition, the flexure 220-1 may be deformed to the X-axis and the Y-axis by the pressure applied when the lift plate 140-1 rises. The lift pins 210 may be vertically aligned in the pin holes 122 to prevent breakage.

Figure 4A:
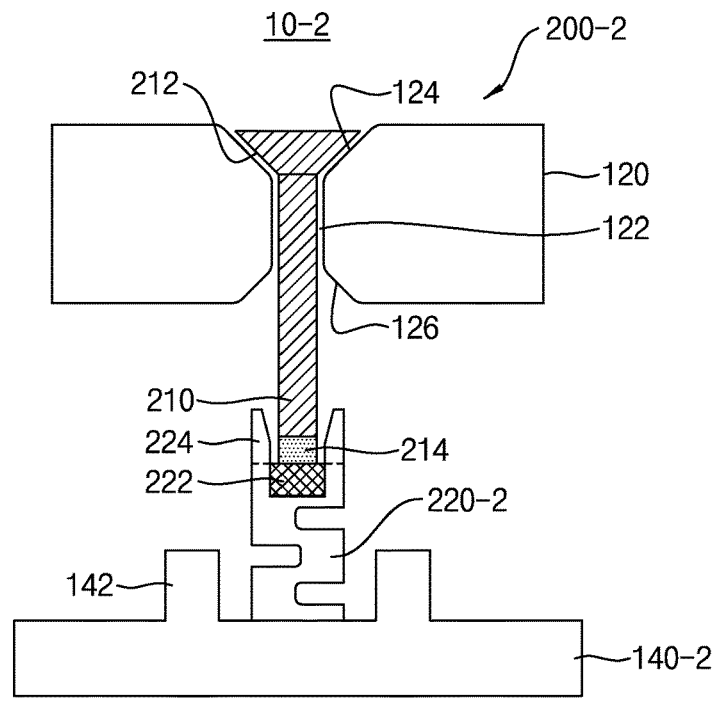
FIG. 4A is a view illustrating a lift pin unit and a lift plate according to an embodiment of the present disclosure.

FIG. 4A is a view illustrating a lift pin unit 200-2 and a lift plate 140-2 according to an embodiment of the present disclosure.

Referring to FIG. 4A, the substrate processing apparatus 10-2 may include a chuck 120, a plurality of lift pin units 200-2, and a lift plate 140-2.

The lift pin unit 200-2 may include a lift pin 210 and a flexure 220-2.

The flexure 220-2 may be bonded, coupled or fastened to the lower portion of the lift pin 210. A metal plate 214 formed of a metal having magnetic properties (for example, iron, nickel, cobalt, etc.) may be disposed below the lift pin 210. The metal plate 214 disposed under the lift pin 210 may be attracted by the magnetism of the magnet 222 disposed above the flexure 220-2. Accordingly, the lift pin 210 and the flexure 220-2 may be magnetically coupled.

A guide part 224 may be formed on the upper side of the flexure 220-2 to guide the coupling of the lift pin 210 and the flexure 220-2. The guide part 224 may protrude vertically from the top edge of the flexure 220-2 so that the lift pin 210 can be inserted. For example, the guide part 224 may protrude vertically toward the lift pin unit 200-2 and have an inclination and/or sloping sidewalls. In this way, the guide part 224 is configured to maintain the lift pin 210 in vertical alignment with the pin hole 122. The metal plate 214 of the lift pin 210 and the magnet 222 of the flexure 220-2 may be vertically aligned by the guide part 224.

When the lift plate 140 is raised, the flexure 220-2 may be easily deformed in the X and Y axis directions so that the lift pin 210 may be vertically aligned. The lift pins 210 may be vertically aligned in the pin holes 122 to prevent breakage of the lift pins 210.

Figure 4B:
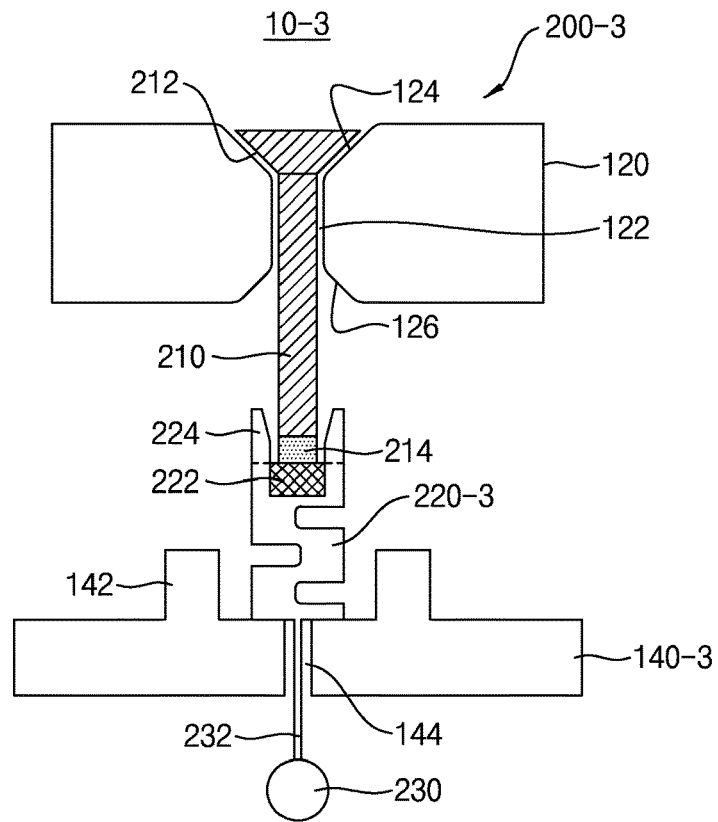
FIG. 4B is a view illustrating a lift pin unit and a lift plate according to one embodiment of the present disclosure.

FIG. 4B is a view illustrating a lift pin unit 200-3 and a lift plate 140-3 according to one embodiment of the present disclosure.

Referring to FIG. 4B, the substrate processing apparatus 10-3 may include a chuck 120, a plurality of lift pin units 200-3, and a lift plate 140-3.

The lift pin unit 200-3 may include a lift pin 210, a flexure 220-3, and a weight body 230.

A guide part 224 may be formed on the upper side of the flexure 220-3 to guide the coupling of the lift pin 210 and the flexure 220-3. The guide part 224 may protrude from the upper edge of the flexure 220-3 so that the lift pin 210 can be inserted. The metal plate 214 of the lift pin 210 and the magnet 222 of the flexure 220 may be vertically aligned by the guide part 224.

A slide stopper 142 may be formed on an upper surface of the lift plate 140-3 to prevent the flexure 220-3 from sliding beyond a predetermined range.

A plurality of string holes 144 may be formed in the lift plate 140-3. Each of the string holes 144 may be formed at positions corresponding to a respective lift pin units 200-3. A weight string 232 may connect the flexure 220-3 and the weight body 230. The first side of the weight string 232 may be connected to the lower portion of the flexure 220-3. The second side of the weight string 232 may be connected to the weight body 230.

Each weight string 232 may pass through the lift plate 140-3 through a corresponding string hole 144. The weight of the weight body 230 is added to the weights of the lift pins 210 and the flexure 220-3 so that the lift pins 210 may be vertically aligned.

Even if the lift plate 140-3 is inclined, the lift pins 210 may be vertically aligned by gravity acting on the weight body 230, thereby preventing and/or suppressing damage to the lift pins 210. In addition, the flexure 220-3 may be deformed to the X and Y axes by the pressure applied when the lift plate 140-3 is raised. The lift pins 210 may be vertically aligned in the pin holes 122 to prevent breakage of the lift pins 210.

Figure 5:
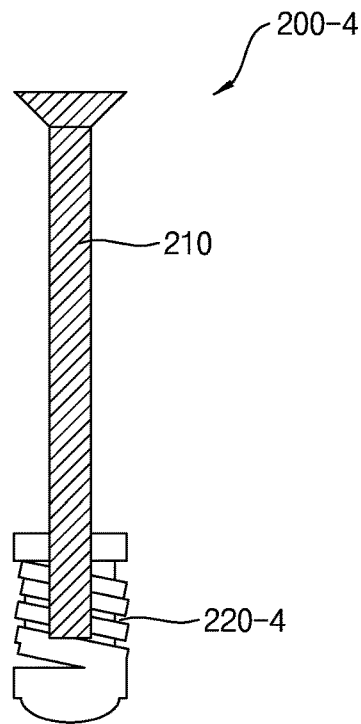
FIG. 5 is a view illustrating an example of the flexure.

FIG. 5 is a view illustrating an example of the flexure 220-4.

Referring to FIGS. 1 and 5, the lift pin unit 200-4 may include a lift pin 210 and a flexure 220-4.

Flexure 220-4 may be a spring-type flexure, for example flexure 220-4 may comprise a spring structure. The spring-type flexure 220-4 may be bonded, coupled, or fastened to the lower portion of the lift pin 210. A metal plate may be disposed below the lift pins 210, and a magnet may be disposed above the flexure 220-4 to magnetically couple the lift pins 210 and the flexure 220-4 to each other. Additionally, the lift pin 210 and the flexure 220-4 may be fastened to each other by using a screw, for example.

When the lift plate 140 is raised, the flexure 220-4 may be easily deformed in the X-axis and Y-axis directions due to the elasticity of the spring-type flexure 220-4 so that the lift pins 210 can be vertically aligned. The flexure 220-4 may be an elastomeric material, for example. The lift pins 210 may be vertically aligned in the pin holes 122 (see FIGS. 1 and 3A) to prevent breakage of the lift pins 210.

Figure 6:
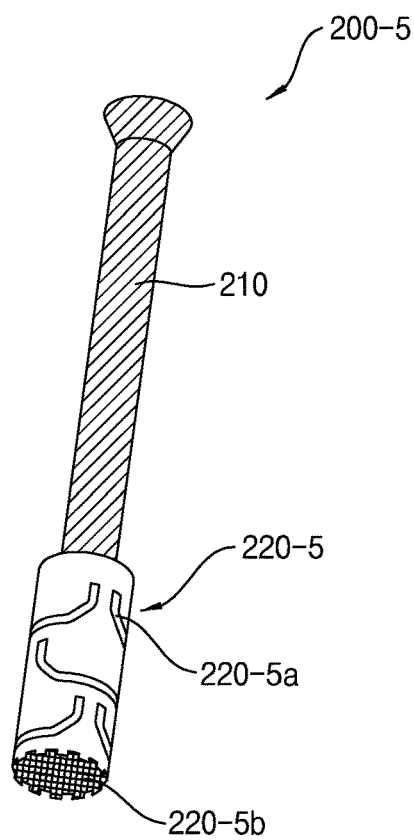
FIG. 6 is a view illustrating an example of a flexure.

FIG. 6 is a view illustrating an example of a flexure 220-5.

Referring to FIGS. 1 and 6, the lift pin unit 200-5 may include a lift pin 210 and a flexure 220-5.

The flexure 220-5 may include a plurality of cutout parts 220-5a configured to allow flexure 220-5 to be easily deformed horizontally in the X and Y axis directions. Additionally, grooves may be formed on the bottom surface 220-5b of the flexure 220-5 to prevent the lift pins 210 from being inclined by particles such as dust or other foreign objects. For example, the bottom surface 220-5b may contact the lift plate 140 at the grooves and any particles may fit between the grooves. Additionally, the grooves may comprise a plurality of raised outdents and a plurality of recessed indents or a cross hatch pattern.

Portions of the circumference of the cylindrical structure of the flexure 220-5 may be cut (recessed) in the X-axis, Y-axis, and oblique directions thereof to form a plurality of cutout parts 220-5a. When pressure is applied to the flexure 220 by lifting the lift plate 140, the plurality of cutout parts 220-5a formed in the flexure 220 extending in the X and Y axis directions, can be easily deformed. For example, the cutout parts 220-5a may be configured as recessed grooves that are configured to enable the flexure 220-5 to deform in the X and Y axis directions and/or the X and Y axis directions obliquely due to flexural force applied to the flexure 220-5. The lift pin 210 may be vertically aligned in the pin hole 122 (refer to FIGS. 1 and 3A) as the flexure 220-5 is deformed in the X and Y axis directions. The lift pins 210 may be vertically aligned in the pin holes 122 to prevent breakage of the lift pins 210.

Figure 7:
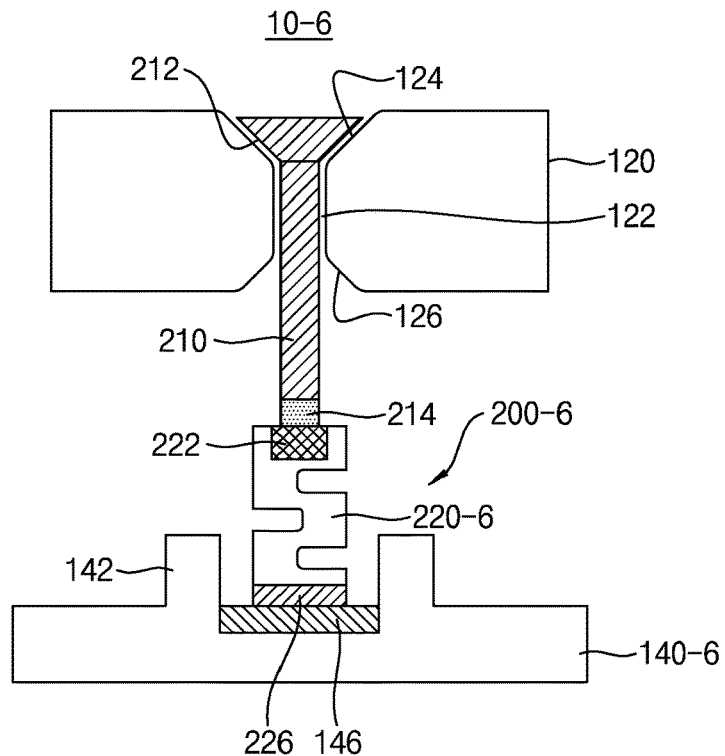
FIG. 7 is a view illustrating a lift pin unit and a lift plate according to an exemplary embodiment of the present disclosure.

FIG. 7 is a view illustrating a lift pin unit 200-6 and a lift plate 140-6 according to an exemplary embodiment of the present disclosure.

Referring to FIG. 7, the substrate processing apparatus 10-6 may include a chuck 120, a plurality of lift pin units 200-6, and a lift plate 140-6.

The lift pin unit 200-6 may include a lift pin 210 and a flexure 220-6.

The flexure 220-6 may be bonded, coupled, or fastened to the lower portion of the lift pin 210. A metal plate 214 (first metal plate) formed of a metal having magnetic properties (for example, iron, nickel, cobalt, etc.) may be disposed below the lift pin 210. The metal plate 214 disposed under the lift pin 210 may be attracted by the magnetism of the magnet 222 disposed above the flexure 220-6. Accordingly, the lift pin 210 and the flexure 220-6 may be magnetically coupled.

When the lift plate 140-6 is raised, the flexure 220-6 may be easily deformed in the X-axis and Y-axis directions so that the lift pins 210 are vertically aligned. For example, the exemplary embodiment illustrated in FIG. 7 may include a flexure 220-6 having a serpentine shape with recessed portions that are configured to enable the flexure 220-6 to deform in the X and Y axis directions and/or the X and Y axis directions obliquely due to flexural force applied to the flexure 220-5. The lift pins 210 may be vertically aligned in the pin holes 122 to prevent breakage of the lift pins 210.

A slide stopper 142 may be formed on an upper surface of the lift plate 140-6. The slide stopper 142 may prevent the flexure 220-6 from sliding beyond a predetermined range.

In order to vertically align the lift pins 210, a metal plate 226 (second metal plate) may be formed under the flexure 220-6. The magnet 146 may be formed on an upper surface of the lift plate 140-6 and may be a permanent magnet, for example. Here, the magnet 146 of the lift plate 140-6 may be disposed at a location between the slide stopper 142 that corresponds to the pin hole 122. For example, magnet 146 may be disposed in a recessed portion of the lift plate 140-6 between the slide stopper 142 such that the uppermost surface of the magnet 146 is at the same level as an uppermost surface of the lift plate 140-6.

When the lift plate 140-6 is raised and lowered, the metal plate 226 disposed below the flexure 220-6 may be attracted by the magnetism of the magnet 146 disposed on the upper surface of the lift plate 140-6. Accordingly, the magnet 146 and the metal plate 226 may be coupled by magnetic force. For example, when the lift plate 140-6 is lowered to a lift down state the coupling between the metal plate 226 and magnet 146 may be broken (not in direct contact) and when the lift plate 140-6 is raised to a lift up state the coupling between the metal plate 226 and magnet 146 may be joined (in direct contact). See, for example, FIGS. 1 and 2. The lift pins 210 may be vertically aligned in the pin holes 122 to prevent breakage of the lift pins 210.

Figure 8:
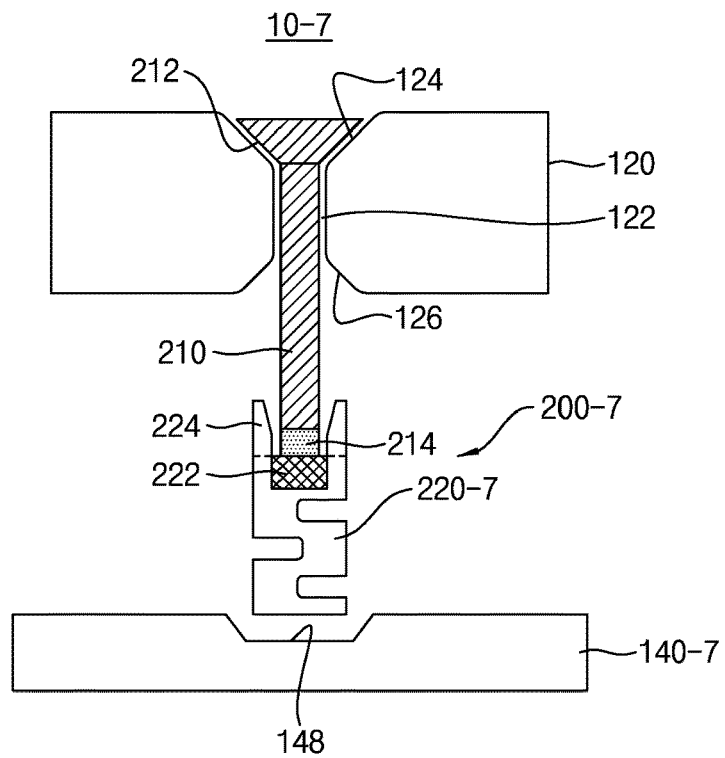
FIG. 8 is a view illustrating a lift pin unit and a lift plate according to an exemplary embodiment of the present disclosure.

FIG. 8 is a view illustrating a lift pin unit 2007-7 and a lift plate 140-7 according to an exemplary embodiment of the present disclosure.

Referring to FIG. 8, the substrate processing apparatus 10-7 may include a chuck 120, a plurality of lift pin units 200-7, and a lift plate 140-7.

The lift pin unit 200-7 may include a lift pin 210 and a flexure 220-7.

The metal plate 214 disposed under the lift pin 210 may be attracted by the magnetism of the magnet 222 disposed above the flexure 220-7. Accordingly, the lift pin 210 and the flexure 220-7 may be magnetically coupled.

A guide part 224 may be formed on the upper side of the flexure 220-7 to guide the coupling of the lift pin 210 and the flexure 220-7. The metal plate 214 of the lift pin 210 and the magnet 222 of the flexure 220-7 may be vertically aligned by the guide part 224.

When the lift plate 140-7 is raised, the flexure 220-7 may be easily deformed in the X and Y axis directions so that the lift pins 210 may be vertically aligned. The lift pins 210 may be vertically aligned in the pin holes 122 to prevent breakage of the lift pins 210.

A stopper groove 148 having a predetermined depth may be formed on an upper surface of the lift plate 140-7. The stopper groove 148 may have inclined sides and a substantially flat lower surface. The stopper groove 148 may be formed to correspond to the pin hole 122 in location and/or size. When the lift plate 140-7 rises, a lower portion of the flexure 220-7 may be inserted into the stopper groove 148. A lower portion of the flexure 220-7 may be inserted into the stopper groove 148, so that the flexure 220-2 may be prevented from sliding beyond a predetermined range due to an upward pressure. The lift pins 210 may be vertically aligned in the pin holes 122 to prevent breakage.

Figure 9:
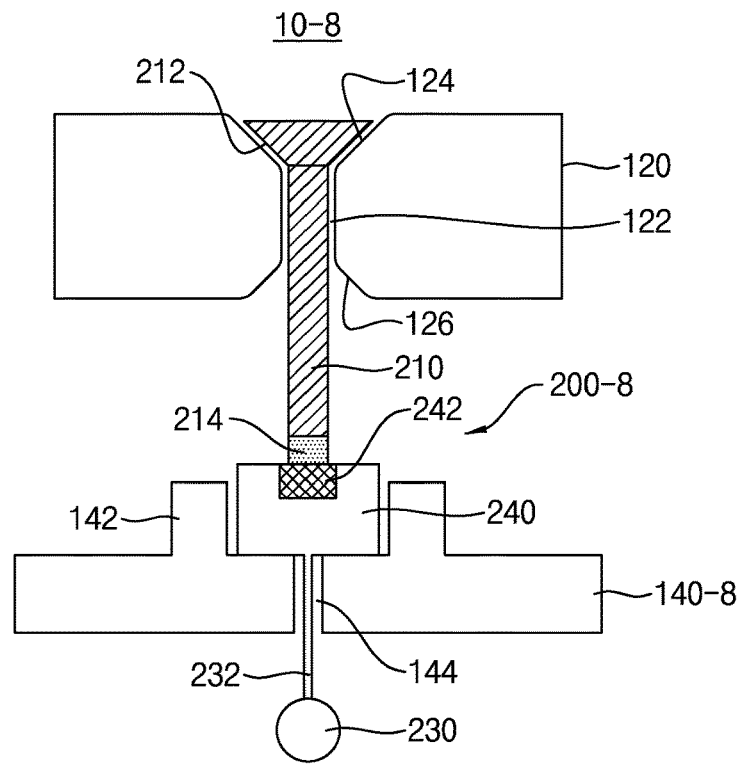
FIG. 9 is a view illustrates a lift pin unit and a lift plate according to an exemplary embodiment of the present disclosure.

FIG. 9 illustrates a lift pin unit 200-8 and a lift plate 140-8 according to an exemplary embodiment of the present disclosure.

Referring to FIG. 9, the substrate processing apparatus 10-8 may include a chuck 120, a plurality of lift pin units 200-8, and a lift plate 140-8.

The plurality of lift pin units 200-8 may include a lift pin 210, a weight block 240, a weight body 230, and a weight string 232.

The weight block 240 and the weight body 230 may be connected by the weight string 232. The weight block 240 may be positioned above the lift plate 140-8, and the weight body 230 may be located below the lift plate 140-8.

A metal plate 214 formed of a metal having magnetic properties (for example, iron, nickel, cobalt, etc.) may be disposed below the lift pin 210. The metal plate 214 may be coupled or bonded to the lower portion of the lift pin 210. A magnet 242 may be formed on the weight block 240.

The metal plate 214 disposed under the lift pin 210 may be attracted by the magnetism of the magnet 242 disposed on the weight block 240. Accordingly, the lift pin 210 and the weight block 240 may be coupled by magnetic force. Additionally, and/or alternatively, the lift pin 210 and the weight block 240 may be fastened to each other through a screw or adhesive, for example.

A slide stopper 142 corresponding to the pin hole 122 may be formed on an upper surface of the lift plate 140-8. The slide stopper 142 may be formed to have the same diameter as the diameter of the pin hole 122. Additionally, and/or alternatively, the slide stopper 142 may be formed to have a diameter (or width) larger than the diameter of the pin hole 122. When the lift plate 140-8 is raised and lowered, the weight block 240 may be located inside the slide stopper 142. The weight body 230 may be vertically aligned with respect to the pin hole 122 by the slide stopper 142.

A plurality of string holes 144 may be formed in the lift plate 140-8. The plurality of string holes 144 may be formed at positions corresponding to the positions of the plurality of lift pin units 200-8. The weight string 232 may connect the weight block 240 and the weight body 230. The first side of the weight string 232 may be connected to the lower portion of the weight block 240. The second side of the weight string 232 may be connected to the weight body 230. The weight string 232 connecting the weight block 240 and the weight body 230 through the plurality of string holes 144 may pass through the lift plate 140-8. The lift pin 210 may be vertically aligned by the weight of the lift pin 210 and the weight of the weight body 230.

When the lift plate 140-8 is raised and lowered, the lift pins 210 may be vertically aligned by the weight body 230. Even if the lift plate 140-8 is inclined, the lift pins 210 may be vertically aligned by the weight body 230, thereby preventing and/or suppressing damage to the lift pins 210.

Figure 10:
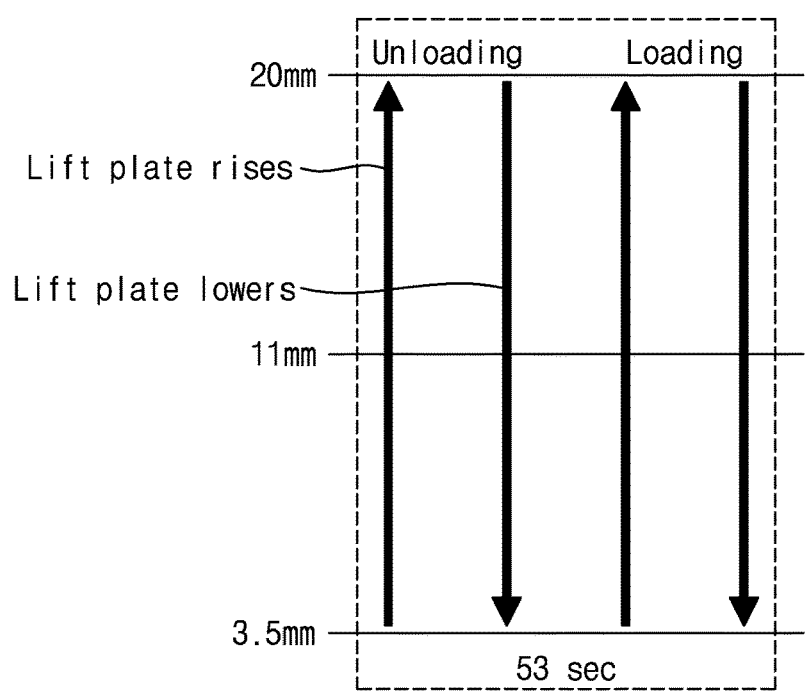
FIGS. 10 to 12 are views illustrating a method of driving a substrate processing apparatus according to an embodiment of the present disclosure.
Figure 11:
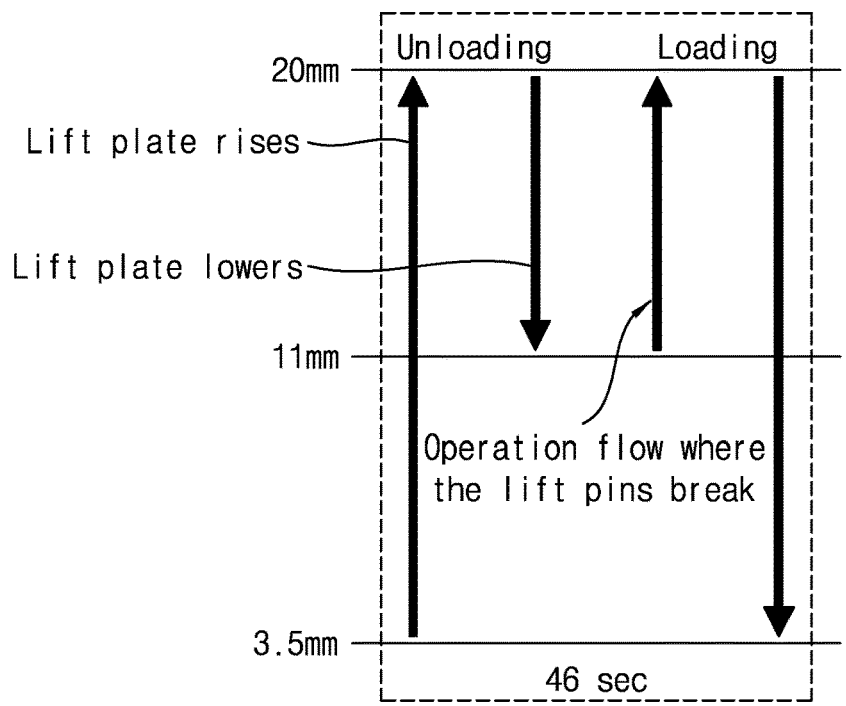
Figure 12:
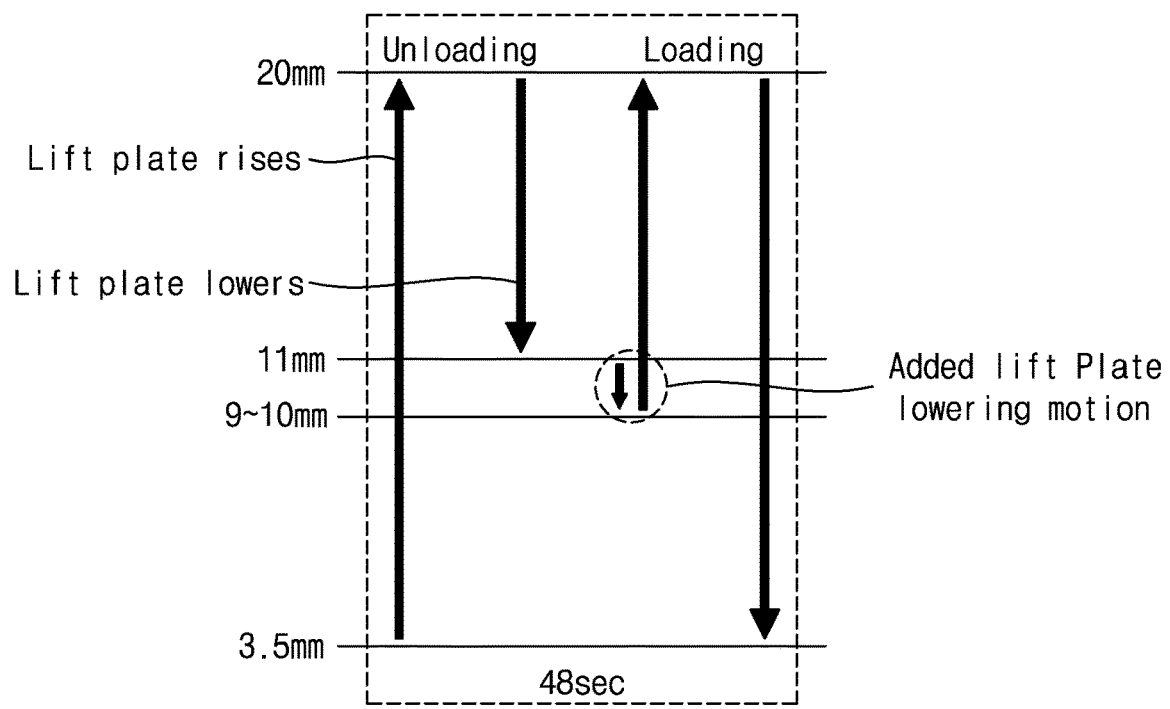

FIGS. 10 to 12 are views illustrating a method of operating a substrate processing apparatus according to an embodiment of the present disclosure.

Referring to FIGS. 1, 2, 3A, and 10, when the process is completed in the chamber 110, the substrate 20 may be unloaded. At this time, the lift plate 140 is raised, and the lift pin 210 is raised. As the lift pin 210 rises, the substrate 20 rises. When the substrate 20 rises, the substrate 20 is unloaded out of the chamber 110 using a robotic arm. After the substrate 20 is unloaded, the lift plate 140 descends, and the lift pin 210 descends.

In order to proceed with the manufacturing process, the substrate 20 may be loaded into the chamber 110. At this time, the lift plate 140 is raised, and the lift pin 210 is raised. The substrate 20 may be disposed on the lift pin 210 that is raised by using the robotic arm. Thereafter, the lift plate 140 is lowered, and the lift pin 210 is lowered. As the lift pin 210 descends, the substrate 20 may be seated on the chuck 120.

When unloading and loading the substrate 20, the lift plate 140 may be raised from the lowest point (e.g., about 3.5 mm above the bottom interior surface of the chamber) to the highest point (e.g., about 20 mm above the bottom interior surface of the chamber). Additionally, the lift plate 140 may be lowered from the highest point to the lowest point. In this case, a first time (for example, about 53 seconds) is required for unloading and loading the substrate 20, a lower than optimal manufacturing efficiency.

Referring to FIGS. 1, 2, 3A, and 11, unloading and loading time of the substrate 20 can be reduced and a manufacturing efficiency can be optimized.

When unloading the substrate 20, the lift plate 140 may be raised to the highest point. Thereafter, the substrate 20 may be unloaded to the outside of the chamber 110 using the robotic arm. After the substrate 20 is unloaded, the lift plate 140 may descend. In this case, the lift plate 140 may be lowered to an intermediate point (e.g., 11 mm above the bottom interior surface of the chamber) without descending to the lowest point. Here, the intermediate point may be a height at which the substrate 20 may be seated on the chuck 120.

When the substrate 20 is loaded, the lift plate 140 may rise from the intermediate point to the highest point. The substrate 20 may be disposed on the lift pin 210 that is raised by using the robotic arm. Thereafter, the lift plate 140 may descend to the lowest point. As the lift pin 210 descends, the substrate 20 may be seated on the chuck 120.

As such, when the lift plate 140 is positioned at the intermediate point during the unloading and loading of the substrate 20, a second time (for example, 46 seconds) for unloading and loading the substrate 20 passes, which can increase manufacturing efficiency. Here, when the lift plate 140 is stopped at the intermediate point, the lift pin 210 may be tilted and pinched in the pin hole 122.

Even when the lift plate 140 is raised in a state in which the lift pin 210 is pinched inside the pin hole 122, the flexure 220 may be bent to straighten the lift pin 210 in the vertical direction. As the flexure 220 is deformed in the X-axis and Y-axis directions, the lift pins 210 are vertically aligned in the pin holes 122, thereby preventing and/or suppressing breakage of the lift pins 210.

Referring to FIGS. 1, 2, 3A, and 12, unloading and loading time of the substrate 20 may be reduced, and breakage of the lift pin 210 may be prevented and/or suppressed.

When the substrate 20 is unloaded, the lift plate 140 may rise to the highest point, and the substrate 20 may be unloaded to the outside of the chamber 110 by using the robotic arm. After the lift plate 140 rises to the highest point, the lift plate 140 may descend. In this case, the lift plate 140 may be lowered to the intermediate point (e.g., 11 mm above the bottom interior surface of the chamber) without descending to the lowest point.

When loading the substrate 20, the lift plate 140 positioned at the intermediate point may further be lowered by a predetermined distance (for example, 1 to 2 mm additional lowering). After the lift plate 140 is further lowered by the predetermined distance, the lift plate 140 may rise to the highest point. That is, when the substrate 20 is loaded, the driving of the lift plate 140 may occur. Here, the lift plate 140 may descend to a first point (e.g., 9 to 10 mm) lower than the intermediate point. Thereafter, the lift plate 140 may rise to the highest point.

The lift plate 140 may rise to the highest point to position the lift pin 210 at the highest point. Thereafter, the substrate 20 may be disposed on the lift pin 210 that is raised using the robotic arm. Thereafter, the lift plate 140 may descend to the lowest point (e.g., 3.5 mm above the bottom interior surface of the chamber). As the lift pin 210 descends, the substrate 20 may be seated on the chuck 120.

As such, when the substrate 20 is loaded, the lift plate 140 may be additionally lowered by about 1 to 2 mm from the intermediate point where the previous substrate was unloaded from. In this case, a third time (for example, 48 seconds) passes to unload and load the substrate 20, thereby increasing manufacturing efficiency.

When the lift plate 140 is stopped at the intermediate point, the lift pin 210 may be inclined and the lift pin 210 may be pinched in the pin hole 122. In this case, when the lift plate 140 is further lowered by about 1 to 2 mm from the intermediate point, the lift pin 210 may be vertically aligned while descending. Thereafter, the lift plate 140 may be raised from the first point (9 to 10 mm above the bottom interior surface of the chamber) to the highest point. When the lift plate 140 is raised and lowered, the lift pins 210 may be vertically aligned in the pin holes 122 to prevent breakage of the lift pins 210.

In addition, when the lift pin 210 is inclined in the pin hole 122, the flexure 220 may be deformed in the X-axis and Y-axis directions. The lift pins 210 may be vertically aligned in the pin holes 122 to prevent breakage.

Figure 13:
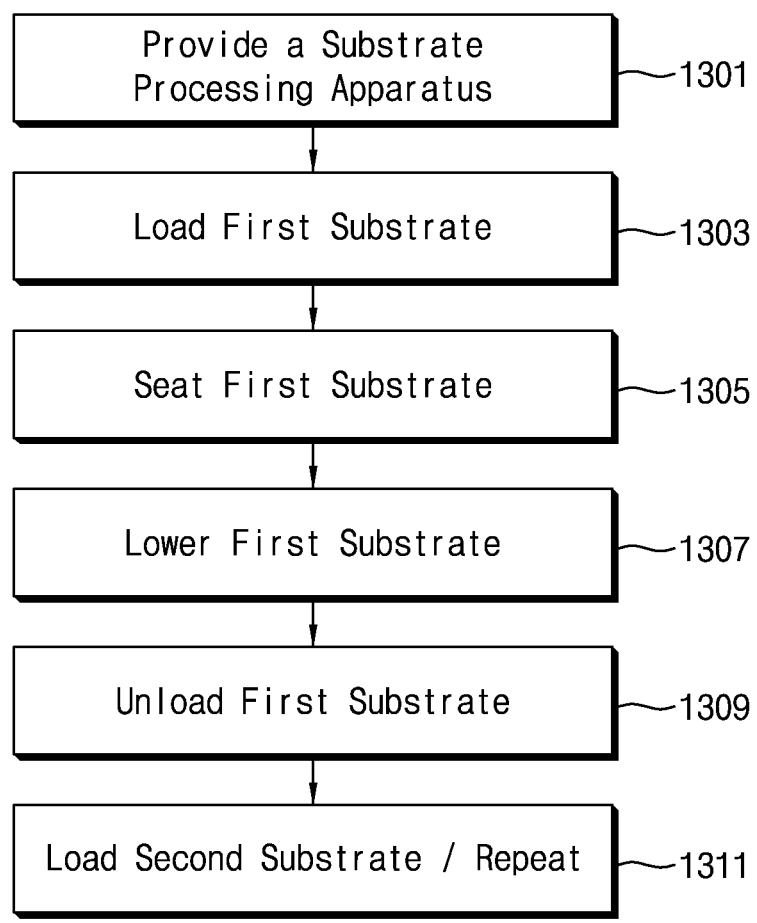
FIG. 13 is a view illustrating a flow chart for a method of manufacturing a semiconductor device.

FIG. 13 illustrates a flow chart for a method of manufacturing a semiconductor device. At step 1301, a substrate processing apparatus may be provided. The substrate processing apparatus may be the same as or similar to the substrate processing apparatus of FIGS. 1 and 2, and may include aspects of the lift pin units 200, lift pins 210, lift plate 140, etc. of FIGS. 3A-9. At step 1303, a first substrate 20 may be loaded into a chamber of the substrate processing apparatus.

When loading the first substrate 20, the lift plate 140 may be raised from a low point (e.g., about 3.5 mm above the bottom interior surface of the chamber) to a high point (e.g., about 20 mm above the bottom interior surface of the chamber). A robotic arm may insert the first substrate 20 into the chamber when the lift plate 140 is at the high point. At step 1305, the first substrate 20 may be seated on the chuck 120 of the substrate 20 processing apparatus. The first substrate 20 may be seated on the chuck 120 by lowering the lift plate 140 from the high point to an intermediate point (e.g., 11 mm above the bottom interior surface of the chamber) without descending to the lowest point. At step 1307, the first substrate 20 may be lowered to the lowest point. Thereafter, at step 1309, the first substrate 20 may be unloaded at the high point. At step 1311, the robotic arm may insert a second substrate 20 into the chamber when the lift plate 140 is at the high point. Those with skill in the art will readily understand that additional undisclosed manufacturing steps that are known in the art may be performed on the substrate.

Throughout the method of manufacturing a semiconductor device, the vertical alignment of the lift pins 210 is maintained with the vertical alignment of the corresponding lift pin holes 122. For example, when the lift plate 140 is raised and lowered, the plurality of lift pins 210 may contact the substrate 20. The plurality of lift pins 120 may each be vertically aligned in a respective pin hole 122 to prevent breakage of the lift pins 210. In addition, if the lift pin 210 is inclined in the pin hole 122, the flexure 220 may be deformed in the X-axis and Y-axis directions. This deformation may enable the lift pins 210 to be vertically aligned in the pin holes 122 to prevent and/or suppress breakage.

While the embodiments of the inventive concept have been described with reference to the accompanying drawings, it should be understood by those skilled in the art that various modifications may be made without departing from the scope of the inventive concept and without changing essential features thereof. Therefore, the above-described embodiments should be considered in a descriptive sense only and not for purposes of limitation.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A substrate processing apparatus including:
   a chuck including a plurality of pin holes;
   a plurality of lift pins positioned to rise and fall through the plurality of pin holes;
   a lift plate configured to raise and lower the plurality of lift pins;
   a first lift pin included among the plurality of lift pins, the first lift pin having a rod shape configured to move up and down in a pin hole of the plurality of pin holes;
   a flexure coupled to a lower portion of the first lift pin and positioned between the chuck and the lift plate;
   a weight body positioned underneath the lift plates; and
   a weight string connecting the flexure and the weight body,
   wherein the lift plate includes a string hole through which the weight string passes through.

2. The substrate processing apparatus of claim 1, wherein the pin hole includes an upper side and a lower side that each includes a funnel-shaped recess.

3. The substrate processing apparatus of claim 1, further comprising:
   a first metal plate disposed below the first lift pin, and
   a first magnet disposed on top of the flexure.

4. The substrate processing apparatus of claim 1, wherein the lift plate further comprises a slide stopper,
   wherein the slide stopper corresponds to the pin hole, and the slide stopper surrounds the flexure.

5. The substrate processing apparatus of claim 1, further comprising a guide part formed on an upper side of the flexure,
   wherein the guide part protrudes from an upper edge of the flexure, and the first lift pin is configured to be inserted into the guide part.

6. The substrate processing apparatus of claim 1, wherein the pin hole and the string hole are vertically aligned.

7. The substrate processing apparatus of claim 1, wherein the flexure comprises a spring structure.

8. The substrate processing apparatus of claim 1, wherein the flexure comprises a cylindrical structure, and the cylindrical structure includes a plurality of cutout parts in the X-axis, Y-axis, and oblique directions.

9. A substrate processing apparatus including:
   a chamber;
   a chuck disposed in the chamber, the chuck including a plurality of pin holes;
   a plurality of lift pins positioned to rise and fall through the plurality of pin holes;
   a lift plate configured to raise and lower the plurality of lift pins;
   a first lift pin included among the plurality of lift pins, the first lift pin having a rod shape and configured to move up and down within a pin hole of the plurality of pin holes;
   a flexure coupled to a lower portion of the first lift pin and positioned between the chuck and the lift plate;
   a first metal plate disposed below the first lift pin; and
   a first magnet disposed on a top of the flexure.

10. The substrate processing apparatus of claim 9, further comprising:
    a second magnet disposed on an upper surface of the lift plate, the second magnet corresponding to the pin hole, and
    a second metal plate disposed underneath the flexure.

11. The substrate processing apparatus of claim 9, wherein the lift plate further includes a stopper groove corresponding to the pin hole, and wherein the flexure is configured to be inserted into the stopper groove.

12. The substrate processing apparatus of claim 9, wherein the pin hole includes an upper side and a lower side that each includes a funnel-shaped recess.

13. The substrate processing apparatus of claim 9, wherein the flexure comprises a spring structure.

14. The substrate processing apparatus of claim 9, wherein the flexure comprises a cylindrical structure, and portions of the cylindrical structure include a plurality of cutout parts in the X axis, Y axis, and oblique directions.

15. A substrate processing apparatus comprising:
    a chamber;
    a chuck disposed in the chamber, the chuck including a plurality of pin holes;
    a plurality of lift pins positioned to rise and fall through the plurality of pin holes;
    a lift plate configured to raise and lower the plurality of lift pins;
    a first lift pin included among the plurality of lift pins, the first lift pin having a rod shape and configured to move up and down within a pin hole of the plurality of pin holes;
    a flexure coupled to a lower portion of the first lift pin and positioned between the chuck and the lift plate; and
    a guide portion disposed above the flexure, the guide portion protruding from an upper edge of the flexure, and the first lift pin being configured to be inserted into the guide portion.

* * * * *